(12) United States Patent
Aipperspach et al.

(10) Patent No.: US 6,404,686 B1
(45) Date of Patent: Jun. 11, 2002

(54) HIGH PERFORMANCE, LOW CELL STRESS, LOW POWER, SOI CMOS LATCH-TYPE SENSING METHOD AND APPARATUS

(75) Inventors: Anthony Gus Aipperspach, Rochester, MN (US); Fariborz Assaderaghi, Mahopac, NY (US); Todd Alan Christensen; Douglas Michael Dewanz, both of Rochester, MN (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/770,912

(22) Filed: Jan. 26, 2001

(51) Int. Cl.$^7$ ................................................. G11C 7/00
(52) U.S. Cl. ...................... 365/205; 365/203; 365/207
(58) Field of Search ............................... 365/205, 203, 365/207, 202, 189.05; 257/347

(56) References Cited

U.S. PATENT DOCUMENTS

| | | | |
|---|---|---|---|
| 5,774,411 A | | 6/1998 | Hsieh et al. |
| 5,796,666 A | * | 8/1998 | Shirley et al. ............. 365/205 |
| 6,133,608 A | * | 10/2000 | Flaker et al. ............. 257/347 |
| 6,229,745 B1 | * | 5/2001 | Nambu ...................... 365/207 |

FOREIGN PATENT DOCUMENTS

JP 403156793 A * 7/1991 ............ G11C/7/00

OTHER PUBLICATIONS

"Low–Power CMOS VLSI Circuit Design" by Kaushik Roy et al., John Wiley & Sons, 2000, pp. 262–263.

"Trends in Low–Power RAM Circuit Technologies" by Itoh et al., IEEE Proceedings, vol. 83, No. 4, pp. 524–543, Apr. 1995.

"A low–Power SRAM Using Improved Charge Transfer Sense Amplifiers and a Dual–Vth CMOS Circuit Scheme" by Fukushi et al., IEEE 1998 Symposium on VLSI Circuits Digest of Technical Papers, 12.3, pp. 142–145.

* cited by examiner

Primary Examiner—David Nelms
Assistant Examiner—David Lam
(74) Attorney, Agent, or Firm—Joan Pennington

(57) ABSTRACT

A high performance, low cell stress, low-power silicon-on-insulator (SOI) complementary metal oxide semiconductor (CMOS) latch-type sensing method and apparatus are provided. A silicon-on-insulator (SOI) complementary metal oxide semiconductor (CMOS) latch-type sense amplifier includes a precharge circuit for charging complementary bit and data lines to a predefined precharge voltage during a precharge cycle. The precharge voltage is lower than a full rail voltage. The reduced bit and data line precharge voltage substantially reduces voltage stress applied to the access transistors in the RAM cells. A pre-amplifying mechanism produces an offset voltage between the complementary data lines before the sense amplifier is set. The pre-amplifying mechanism includes a pre-amplifying FET that is substantially smaller than a sensing silicon-on-insulator (SOI) field effect transistor (FET) in the sense amplifier. The pre-amplifying mechanism aids offset voltage development before the sense amplifier is set. The full rail voltage is provided for the complementary data lines when the sense amplifier is set. The full rail voltage can be applied during the write mode.

19 Claims, 3 Drawing Sheets

COMPLEMENTARY DATA LINE WAVEFORM
COMPARISON BETWEEN PRIOR ART AND
SENSE AMP 100

HIGH PERFORMANCE, LOW CELL STRESS, LOW POWER, SOI CMOS LATCH-TYPE SENSING METHOD AND APPARATUS

FIELD OF THE INVENTION

The present invention relates generally to complementary metal oxide semiconductor (CMOS) latch-type sensing method and apparatus, and more particularly, relates to a high performance., low cell stress, low power, silicon-on-insulator (SOI) complementary metal oxide semiconductor (CMOS) latch-type sensing method and apparatus.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology will lead to the development of more complex and faster computer integrated circuits that operate with less power.

Various arrangements have been proposed to overcome some of the problems with partially depleted SOI technology. One of the more pronounced problems observed in partially depleted SOI technology is the degraded cell stability. This degraded cell stability is caused by half selected cell disturb sensitivity. With excessive N-channel field effect transistor (NFET) body charge accumulation and uncontrollably low Vt in the access transistor of an SOI RAM cell, the SOI RAM cell content may be unintentionally overwritten under a half-selected condition; that is when it is adjacent to a currently selected cell on the same word line.

A need exists for a high performance, low cell stress, low power, silicon-on-insulator (SOI) complementary metal oxide semiconductor (CMOS) latch-type sensing method and apparatus.

SUMMARY OF THE INVENTION

A principal object of the present invention is to provide a high performance, low cell stress, low power, silicon-on-insulator (SOI) complementary metal oxide semiconductor (CMOS) latch-type sensing method and apparatus. Other important objects of the present invention are to provide such high performance, low cell stress, low power, silicon-on-insulator (SOI) complementary metal oxide semiconductor (CMOS) latch-type sensing method and apparatus substantially without negative effect and that overcome many of the disadvantages of prior art arrangements.

In brief, a high performance, low cell stress, low power, silicon-on-insulator (SOI) complementary metal oxide semiconductor (CMOS) latch-type sensing method and apparatus are provided. A silicon-on-insulator (SOI) complementary metal oxide semiconductor (CMOS) latch-type sense amplifier includes a precharge circuit for charging complementary data lines to a predefined precharge voltage during a precharge cycle. The precharge voltage is lower than a full rail voltage. A pre-amplifying mechanism produces an offset voltage between the complementary data lines before the sense amplifier is set.

In accordance with features of the invention, the pre-amplifying mechanism includes a pre-amplifying FET that is substantially smaller than a sensing silicon-on-insulator (SOI) FET in the sense amplifier. The full rail voltage is provided for the complementary data lines when the sense amplifier is set. The full rail voltage can be applied during the write mode.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENT

Figure 1:
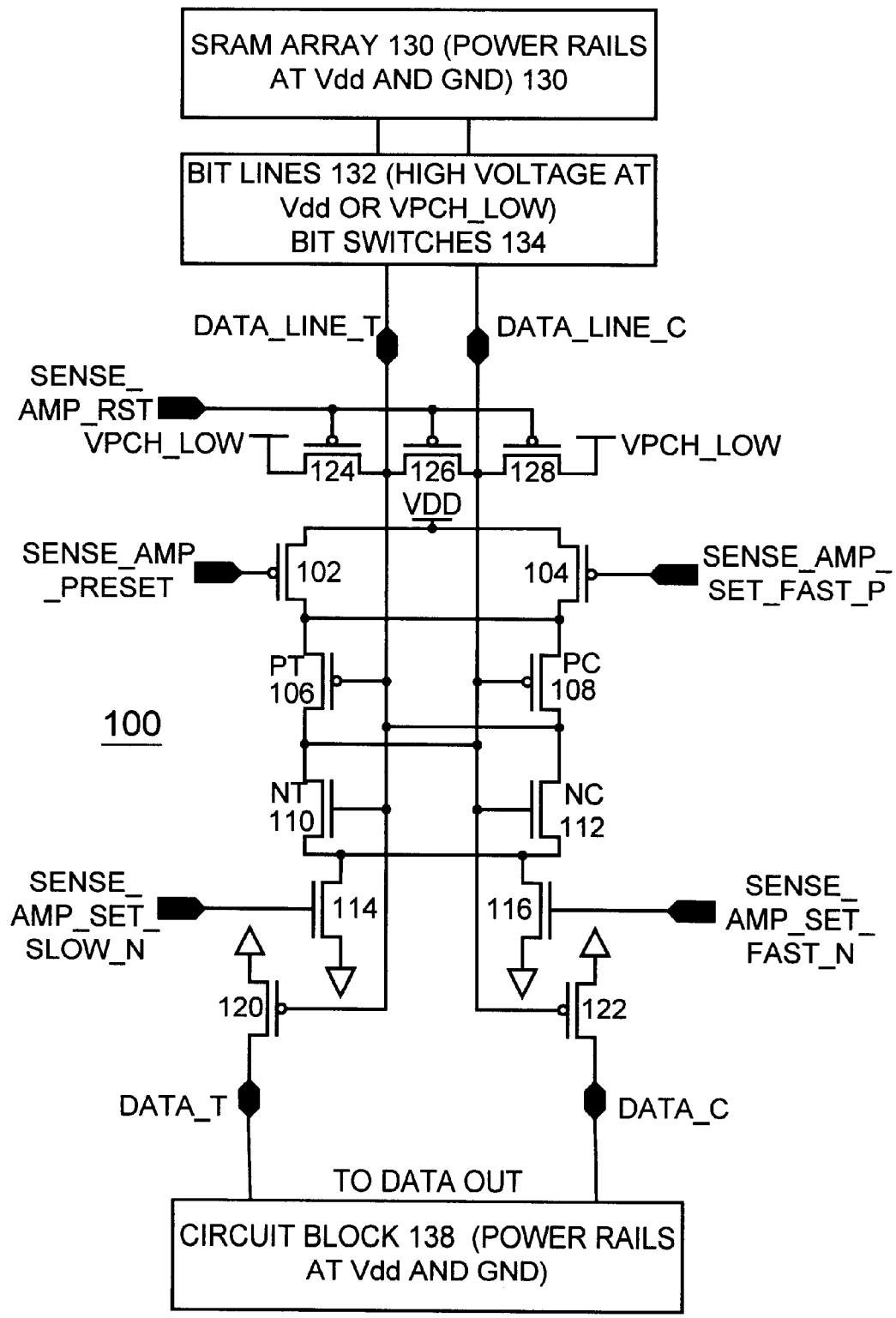
FIG. 1 is a schematic and block diagram representation illustrating a high performance, low cell stress, silicon-on-insulator (SOI) complementary metal oxide semiconductor (CMOS) latch-type sense amplifier in accordance with the preferred embodiment.

Having reference now to the drawings, in FIG. 1, there is shown a high performance, low cell stress, low power, silicon-on-insulator (SOI) complementary metal oxide semiconductor (CMOS) latch-type sense amplifier of the preferred embodiment generally designated by the reference character 100. As shown in FIG. 1, SOI CMOS latch-type sense amplifier 100 includes a pair of P-channel field effect transistors (PFETs) 102 and 104 respectively connected between a voltage supply Vdd and a second pair of cross-coupled P-channel field effect transistors (PFETs) 106 and 108. PFET 102 is a sense amp preset control PFET. PFET 104 is a sense amplifier triggering PFET that is turned on with gate control sense amp_set_fast_P. A pair of cross-coupled N-channel field effect transistors (NFETs) 110 and 112 are respectively connected to the second pair of P-channel field effect transistors (PFETs) 106 and 108.

PFET 102 receives a gate input of sense_amp_preset. PFET 104 receives a gate input of sense_amp_set_fast_P. A gate of PFET 106 and NFET 110 is connected to a Data_line_T. A gate of PFET 108 and NFET 112 is connected to a Data_line_C. A pair of NFETs 114 and 116 respectively connected between NFETs 110 and 112 and ground, receives a gate input of sense_amp_set_slow_N and sense_amp_set_fast_N. A pair of P-channel field effect transistors (PFETs) 120 and 122 having a respective gate input of Data_line_T and Data_line_C, are respectively connected between ground and data out, Data_T and Data_C. A gate input of sense_amp_rst is applied to a gate of a plurality of PFETs 124,126 and 128. PFET 124 is connected between voltage Vpch_low and Data_line_T. PFET 128 is connected between voltage Vpch_low and Data_line_C. The voltage Vpch_low is lower than the voltage supply voltage Vdd, and is for example, a mid-rail voltage potential. PFET 126 is connected between Data_line_T and Data_line_C.

A SRAM array 130 are connected by bit lines 132 and bit switches 134 to the data lines, Data_line_T and Data_line_C. Bit lines 132 are referenced as the section of complementary bit lines directly coupled to the RAM cells. Data lines are referenced as the section of complementary bit lines directly coupled to the sense amplifier 100. Bit lines 132 and data lines, Data_line_T and Data_line_C are separated by bit switches 134, usually implemented in the form of passgate circuits. The SRAM array 130 includes power rails at voltage supply Vdd and ground. The high voltage of bit lines 132 is voltage supply Vdd or Vpch_low. A circuit block 138 is connected to the data out, Data_T and Data_C of the sense amplifier 100. The circuit block 138 includes power rails at voltage supply Vdd and ground. Sense amplifier 100 maintains voltage compatibility with other parts of the circuit, such as SRAM ARRAY 130 and circuit block 138.

In accordance with features of the preferred embodiment, lower than full rail precharge voltage is provided for the complementary bit lines; lower than full rail precharge voltage is provided for the complementary data lines during the precharge cycle; and full rail voltage is provided for the complementary data lines during the sense amplifier firing cycle. Bit lines are biased at a low voltage potential (Vpch_low) as long and as frequently as possible to prevent excessive NFET body charge accumulation and uncontrollably low Vt in the access transistor of an SOI RAM cell. To maintain high sensing sensitivity and performance, data lines are able to operate between Vdd and ground during actual sensing (READ); and bit lines also retain full rail swing between Vdd and ground during WRITE of the cell. Low-current pre-amplifying PFET 102 is activated before triggering and the full amplifying NFETs 110, 112 and PFETs 106, 108 are activated after the onset of firing signals.

In accordance with features of the preferred embodiment, sense amplifier 100 operates under a lower-than-full-rail bit line and data line precharge voltage, Vpch_low, while delivering good sensing performance. The bit line voltage is precharged to a level Vpch_low substantially lower than the supply voltage Vdd in order to reduce stress to the memory cell in the form of excessive passgate low-Vt floating body leakage current affecting the storage node, which is the source of half-select instability, that is unintentional WRITE error. To perform a WRITE function, selected bit lines can undergo rail-to-rail operation, as which is most performance beneficial when altering the content of cell needs to be altered during WRITE. Other cells on the same selected word lines still have their bit lines precharged to a voltage lower than full rail such that an unintentional WRITE due to the half select condition can be avoided. Such bit line precharge operation substantially lower than the supply voltage Vdd enhances the reliability of SRAM arrays in a partially depleted SOI technology. Also design characteristics in terms of balancing leakage and performance are optimized.

In accordance with features of the preferred embodiment, the addition of the pre-amplifying PFET 102 in the sense amplifier 100 aids the offset voltage development before the sense amplifier is fired. This effectively compensates the longer transition time needed for the slower side of the data line which goes from mid-rail to the supply voltage Vdd. The sense amplifier 100 maintains high performance in spite of sensing action being initiated from a mid-rail voltage. The "1" side of the data line voltage goes to full Vdd after firing of the sense amplifier 100 and only returns to mid-rail precharged state after passing of data to other parts of the circuit employing normal Vdd. Voltage interface compatibility as well as overall READ performance is thus preserved in this method. Also, the benefit of power saving is achieved as a result of the lower bit line precharge voltage.

Figure 2A:
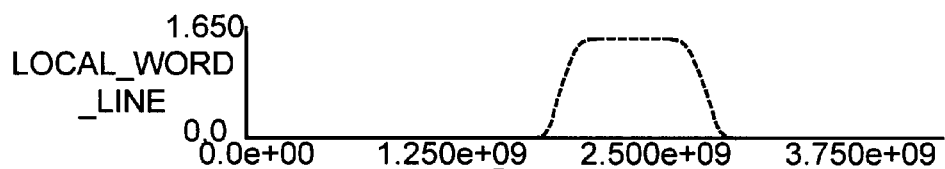
FIGS. 2A, 2B, 2C, 2D, 2E, 2F and 2G are diagrams with voltage shown with respect to the vertical axis and time shown with respect to the horizontal axis illustrating an exemplary set of control waveforms for the SOI CMOS latch-type sense amplifier of FIG. 1 in accordance with the preferred embodiment.
Figure 2B:
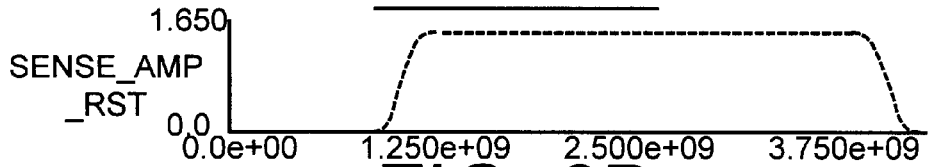
Figure 2C:
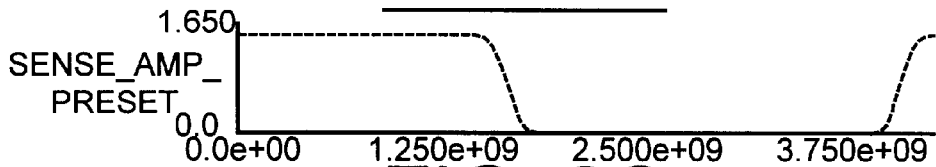
Figure 2D:
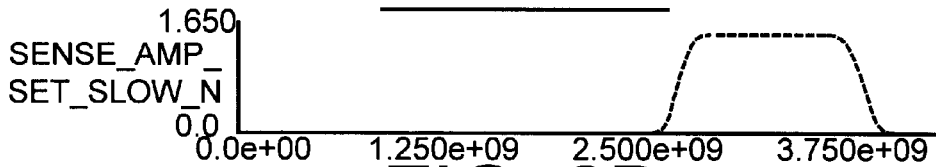
Figure 2E:
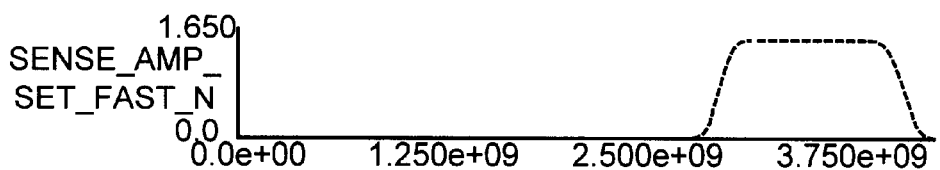

Referring to FIGS. 2A, 2B, 2C, 2D, 2E, 2F, 2G and 3, operation of the sense amplifier 100 may be understood as follows. Pre-amplifying PFET 102 is enabled when the local word lines are turned on. This PFET 102 is made small so that it amplifies the voltage offset in a predictable and linear fashion for a known period of time. When the offset becomes sufficiently mature, the sense amplifier 100 is fired by fully turning on the triggering devices, namely NFET 116 with gate input sense_amp_set_fast_N and PFET 104 with gate input sense_amp_set_fast_P. Both set devices, PFET 104 and NFET 116 are sized to provide adequate current to produce high-gain amplification. PFET 104 and NFET 116 can be triggered at the same time, as shown in FIGS. 2D and 2E, but are not necessarily triggered at the same time. The preamplification action, relying on weak cross-coupled PFET configuration is essential to result in high performance and sense point stability. High performance is achieved by accelerated offset development, as a result of pre-amplification provided by PFET 102. Sense point stability is achieved via limiting the gain by way of the small preset PFET 102, which effectively prevents the possibility of current jamming and corruption of the amplifying latch. Because of the effectiveness of preamplification, the need for NFET 114 with gate input sense_amp_set_slow_N usually is eliminated. NFET 114 with gate input sense_amp_set_slow_N is often required in a conventional high performance sense amplifier to bring the precharged lines closer to the sense point.

Figure 2F:
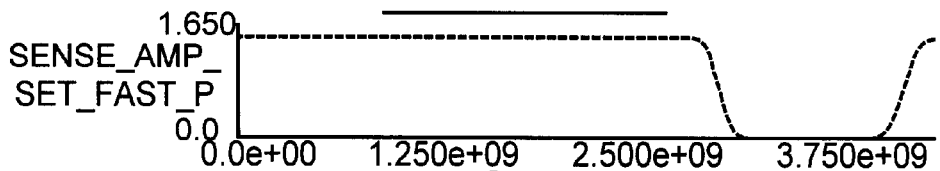
Figure 2G:
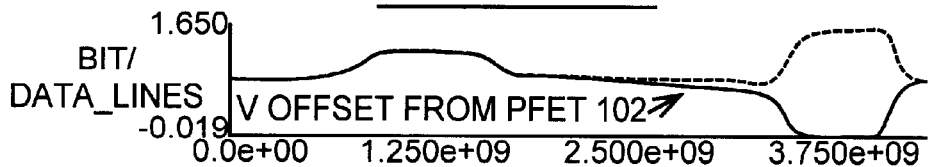

FIGS. 2A, 2B, 2C, 2D, 2E, 2F, 2G and 3 provide simulations of voltage waveforms to understand the operation of the sense amplifier 100 of the preferred embodiment. It should be understood that the pulse width and alignment should be considered relative depending on specific timing requirement and signal availability. In FIGS. 2A, 2B, 2C, 2D, 2E, 2F, 2G and 3, the high voltage supply Vdd of sense amplifier 100 is 1.65 Volts. FIG. 2A illustrates a voltage waveform of a local_word_line of SRAM array 130. FIG. 2B illustrates a voltage waveform of sense_amp_rst applied to the gate of PFETs 124, 126 and 128 to bias the complementary data lines to Vpch_low. FIG. 2C illustrates a voltage waveform of sense_amp_preset applied to the gate of sense amp preset control PFET 102. FIGS. 3D and 2E respectively illustrate voltage waveform sense_amp_set_slow_N applied to the gate of sense amp set NFET 114 and voltage waveform sense_amp_set_fast_N applied to the gate of sense amp set NFET 116. FIG. 2F illustrates a voltage waveform of sense_amp_set_fast_P applied to the gate of sense amp set PFET 104. FIG. 2G illustrates corresponding voltage waveforms of bit/data_lines. Note the offset voltage developed by the PFET 102 in the voltage waveforms of bit/data_lines.

Figure 3:
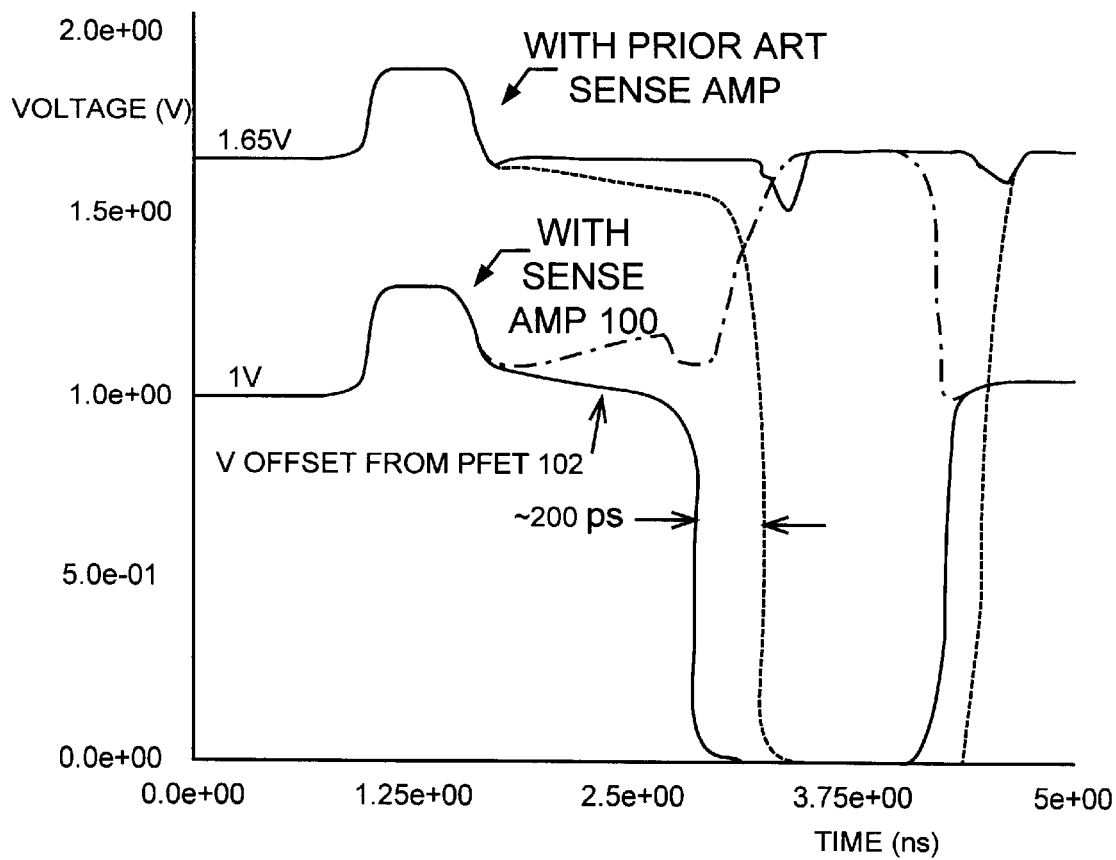
FIG. 3 is a diagram with voltage shown with respect to the vertical axis and time shown with respect to the horizontal axis illustrating exemplary complementary data line performance waveforms for the SOI CMOS latch-type sense amplifier of FIG. 1 using the set of control waveforms of FIGS. 2A, 2B, 2C, 2D, 2E, and 2F in comparison with a conventional sense amplifier in accordance with the preferred embodiment.

FIG. 3 illustrates exemplary complementary data line performance waveforms for the SOI CMOS latch-type sense amplifier 100 using the set of control waveforms of FIGS. 2A, 2B, 2C, 2D, 2E, and 2F for comparison with a conventional sense amplifier. In FIG. 3, upper curves represent the typical behavior of a conventional high-performance latch-type sense amplifier. Lower curves represent the operation of high-performance latch-type sense amplifier 100 of the preferred embodiment. This comparison is provided with equivalent cross-coupled NFET strength for both amplifier configurations. Both amplifiers are set or fired when at an offset voltage of 150 mV. With the pre-amplification mechanism of the high-performance latch-type sense amplifier 100 of the preferred embodiment, the set signals can be moved earlier by about 200 ps. This not only compensates the slower switching transient due to the larger voltage swing from mid-rail to Vdd, but results in a faster overall sensing speed by over 100 ps. In an optimized design, the beta ratio should favor the slower mid-rail to Vdd transition to improve that part of the slope, δV/δt.

While the present invention has been described with reference to the details of the embodiments of the invention shown in the drawing, these details are not intended to limit the scope of the invention as claimed in the appended claims.

What is claimed is:

1. A silicon-on-insulator (SOI) complementary metal oxide semiconductor (CMOS) latch-type sense amplifier including a plurality of sensing SOI field effect transistors (FETs) comprising:
    a precharge circuit for charging complementary data lines to a predefined precharge voltage during a precharge cycle; said precharge voltage being lower than a full rail voltage; and
    a pre-amplifying field effect transistor (FET) receiving a preset control input for producing an offset voltage between said complementary data lines before the sense amplifier is set; said pre-amplifying FET being a low current pre-amplifying FET substantially smaller than the SOI FETs.

2. A silicon-on-insulator (SOI) complementary metal oxide semiconductor (CMOS) latch-type sense amplifier as recited in claim 1 wherein said precharge circuit includes a plurality of field effect transistors connected to said complementary data lines, each receiving a sense amp reset gate input to bias the complementary data lines to said predefined precharge voltage.

3. A silicon-on-insulator (SOI) complementary metal oxide semiconductor (CMOS) latch-type sense amplifier as recited in claim 2 wherein said predefined precharge voltage is a predetermined mid-rail voltage.

4. A silicon-on-insulator (SOI) complementary metal oxide semiconductor (CMOS) latch-type sense amplifier comprising:
    a precharge circuit for charging complementary data lines to a predefined precharge voltage during a precharge cycle; said precharge voltage being lower than a full rail voltage; and
    a pre-amplifying mechanism for producing an offset voltage between said complementary data lines before the sense amplifier is set; said pre-amplifying mechanism including a pre-amplifying field effect transistor (FET) coupled between a voltage supply rail and a sensing silicon-on-insulator (SOI) field effect transistor (FET) and said pre-amplifying FET having a sense amp preset gate input.

5. A silicon-on-insulator (SOI) complementary metal oxide semiconductor (CMOS) latch-type sense amplifier as recited in claim 4 wherein said sensing SOI FET includes a pair of cross-coupled N-channel field effect transistors and a pair of cross-coupled P-channel field effect transistors.

6. A silicon-on-insulator (SOI) complementary metal oxide semiconductor (CMOS) latch-type sense amplifier as recited in claim 5 wherein each said pair of cross-coupled N-channel field effect transistors and said pair of cross-coupled P-channel field effect transistors includes a respective gate input connection to said complementary data lines.

7. A silicon-on-insulator (SOI) complementary metal oxide semiconductor (CMOS) latch-type sense amplifier as recited in claim 5 wherein said pre-amplifying field effect transistor (FET) is a pre-amplifying P-channel field effect transistor (PFET) coupled between a high voltage supply rail and said pair of cross-coupled PFETs.

8. A silicon-on-insulator (SOI) complementary metal oxide semiconductor (CMOS) latch-type sense amplifier as recited in claim 7 includes a triggering P-channel field effect transistor (PFET) coupled between said high voltage supply rail and said pre-amplifying PFET and said triggering PFET having a sense amp set gate input.

9. A silicon-on-insulator (SOI) complementary metal oxide semiconductor (CMOS) latch-type sense amplifier as recited in claim 8 wherein said pre-amplifying PFET is substantially smaller than said triggering PFET.

10. A silicon-on-insulator (SOI) complementary metal oxide semiconductor (CMOS) latch-type sense amplifier as recited in claim 4 wherein said pre-amplifying PFET is substantially smaller than said sensing SOI FET.

11. A silicon-on-insulator (SOI) complementary metal oxide semiconductor (CMOS) latch-type sense amplifier as recited in claim 4 includes said full rail voltage for said complementary data lines when the sense amplifier is set.

12. A method for implementing enhanced operation of a silicon-on-insulator (SOI) complementary metal oxide semiconductor (CMOS) latch-type sense amplifier, said method comprising the steps of:
    charging complementary data lines to a predefined precharge voltage during a precharge cycle; said precharge voltage being lower than a full rail voltage;
    providing a pre-amplifying mechanism including a pre-amplifying field effect transistor (FET) coupled between a voltage supply rail and a sensing silicon-on-insulator (SOI) field effect transistor (FET) and said pre-amplifying FET having a sense amp preset gate input; and
    applying a sense amp preset control signal to said pre-amplifying FET gate input for producing an offset voltage between said complementary data lines before the sense amplifier is set.

13. A method for implementing enhanced operation of a silicon-on-insulator (SOI) complementary metal oxide semiconductor (CMOS) latch-type sense amplifier as recited in claim 12 further includes the step of providing said full rail voltage for said complementary data lines when the sense amplifier is set.

14. A method for implementing enhanced operation of a silicon-on-insulator (SOI) complementary metal oxide semiconductor (CMOS) latch-type sense amplifier as recited in claim 12 wherein the step of charging complementary data lines to a predefined precharge voltage during a precharge cycle; said precharge voltage being lower than a full rail voltage includes the steps of providing a plurality of field effect transistors connected to said complementary data lines, applying a sense amp reset gate input to each of said plurality of field effect transistors to bias the complementary data lines to said predefined precharge voltage.

15. A method for implementing enhanced operation of a silicon-on-insulator (SOI) complementary metal oxide semiconductor (CMOS) latch-type sense amplifier as recited in claim 12 wherein the step of providing a pre-amplifying mechanism including a pre-amplifying field effect transistor (FET) coupled between a voltage supply rail and a sensing silicon-on-insulator (SOI) field effect transistor (FET) and said pre-amplifying FET having a sense amp preset gate input; and applying a sense amp preset control signal to said pre-amplifying FET gate input for producing an offset voltage between said complementary data lines before the sense amplifier is set includes the step of providing said pre-amplifying field effect transistor (FET) coupled between said voltage supply rail and a pair of cross-coupled sensing N-channel field effect transistors and a pair of cross-coupled sensing P-channel field effect transistors, each of said cross-coupled sensing NFETs and each of said cross-coupled sensing PFETs having a gate input connection to a respective complementary data line.

16. A method for implementing enhanced operation of a silicon-on-insulator (SOI) complementary metal oxide semiconductor (CMOS) latch-type sense amplifier as recited in claim 15 further includes the steps of providing a pre-amplifying P-channel field effect transistor (PFET) coupled between said high voltage supply rail and said pair of cross-coupled PFETs and providing a triggering P-channel field effect transistor (PFET) coupled between said high voltage supply rail and said pre-amplifying PFET and applying a sense amp set gate input to said triggering PFET.

17. A method for implementing enhanced operation of a silicon-on-insulator (SOI) complementary metal oxide semiconductor (CMOS) latch-type sense amplifier as recited in claim 16 providing a substantially smaller pre-amplifying PFET than said triggering PFET.

18. A method for implementing enhanced operation of a silicon-on-insulator (SOI) complementary metal oxide semiconductor (CMOS) latch-type sense amplifier as recited in claim 12 providing a substantially smaller pre-amplifying FET than said sensing silicon-on-insulator (SOI) field effect transistor (FET).

19. A method for implementing enhanced operation of a silicon-on-insulator (SOI) complementary metal oxide semiconductor (CMOS) latch-type sense amplifier as recited in claim 12 includes the step of providing said predefined precharge voltage at a mid-rail voltage potential.

* * * * *